United States Patent [19]

Tsuboshima et al.

[11] 4,305,132
[45] Dec. 8, 1981

[54] METHOD TO ELIMINATE THE NOISE AT KNOWN FREQUENCY

[75] Inventors: Kosaku Tsuboshima; Noriaki Ono, both of Hachiouji; Seiichi Hosoda, Fuchu, all of Japan

[73] Assignee: Olympus Optical Co., Ltd., Tokyo, Japan

[21] Appl. No.: 97,666

[22] Filed: Nov. 27, 1979

[30] Foreign Application Priority Data

Nov. 30, 1978 [JP] Japan ................... 53-148174

[51] Int. Cl.³ ................ G06F 15/20; H04B 15/00
[52] U.S. Cl. ................ 364/574; 364/734; 364/575; 455/63; 455/296

[58] Field of Search ........... 364/734, 575, 574, 572, 364/484; 324/78 F; 328/165; 358/177; 455/50, 63, 222, 223, 278, 283, 296, 298

[56] References Cited

U.S. PATENT DOCUMENTS

| | | | |
|---|---|---|---|
| 4,086,651 | 4/1978 | Muir et al. | 364/574 X |
| 4,192,003 | 3/1980 | Brock et al. | 364/574 X |
| 4,193,118 | 3/1980 | Nash et al. | 364/575 X |

Primary Examiner—Edward J. Wise
Attorney, Agent, or Firm—Cushman, Darby & Cushman

[57] ABSTRACT

In measurement of signals containing noise at a known frequency, a method to eliminate noise at a known frequency of T so adapted as to obtain correct value of the signal free from noise by repeating measurements of signal levels at time interval of T/2 and averaging the values obtained by said measurements.

5 Claims, 3 Drawing Figures

METHOD TO ELIMINATE THE NOISE AT KNOWN FREQUENCY

BACKGROUND OF THE INVENTION (a) Field of the Invention

The present invention relates to a method of eliminating noise in measurements of very low current signals such as those with ion electrodes.

(b) Description of the Prior Art

In instruments for measuring low signals with an ion electrode or a similar means, various types of noise will degrade signal-to-noise ratio and constitute a great hindrance to enhancement of measuring accuracy. Elimination of noise is therefore an important problem for such measurements. Among various types of noise mentioned above, hum from an AC electric power source is at a known frequency and band-pass filters have conventionally been used to eliminate the hum from AC power source. However, this conventional method required a filter and, in addition, could not eliminate such noise sufficiently. The hum coming from the AC electric power source exists in a condition overlapped with DC current signal 1 as shown in FIG. 1. It is therefore conceivable to measure signal level for a short time and average the measured signal as a method to eliminate hum 2 coming from the electric power source without using a filter. However, the hum from the AC electric power source cannot be eliminated through averaging without measuring the signal level for a time which is short but far longer than the frequency of the hum. When the hum is measured for a long time, the level of the signal component may vary during the measurement, thereby making it impossible to determine it correctly at a definite moment of measurement.

SUMMARY OF THE INVENTION

A general object of the present invention is to provide, in measuring instruments for processing signals at low levels, a noise elimination method comprising repeating measurements in an even number of times at a definite time interval and averaging measured values thus obtained, whereby components of noise at known frequency such as hum in AC line are mutually canceled and eliminated from the measured value.

DESCRIPTION OF THE PREFERRED EMBODIMENT

Figure 1:
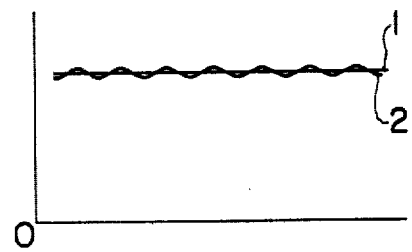
FIG. 1 shows a diagram illustrating a DC signal component overlapped with noise.
Figure 2:
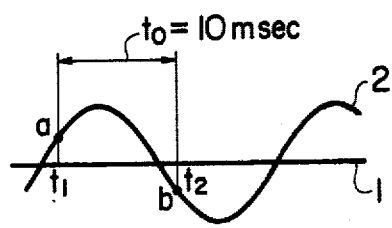
FIG. 2 shows a diagram illustrating a part of FIG. 1 on an expanded scale.

Now, the noise elimination method according to the present invention will be described more detailedly with reference to the accompanying drawings. In FIG. 2 illustrating a part of FIG. 1 on an expanded scale, a DC signal component 1 is overlapped with noise 2 at a known frequency such as hum coming from an AC electric power source. When it is assumed that the electric power source is rated for 50 Hz, the noise produced in this power line also has a period of 50 Hz. Let us further assume that measurements of the DC signal component shown in FIG. 2 are effected at times $t_1$ and $t_2$ defined in the drawing and give measured values of a and b respectively. Let us suppose that the time interval $t_0$ as measured from time $t_1$ to time $t_2$ is selected at 10 msec and the DC component 1 is set at level 0. Then, the AC hum 2 produced by the electric power source follows a sine curve, establishing a relationship of $a = -b$ between the values a and b measured at time $t_1$ and time $t_2$. By selecting the time interval $t_0$ between the sampling time $t_1$ and time $t_2$ at 10 msec and averaging measured values obtained at both the sampling times, it is possible to mutually cancel both the values of AC hum in the power line so as to obtain DC signal free from such AC hum. In this case, the sampling time interval is not limited to 10 msec only but may be products of 10 msec multiplied by factors of odd numbers, i.e., $(2n+1)t_0$ ($t_0 = 10$ msec).

Though the foregoing descriptions are given for a case where hum is produced by an AC electric power source rated for 50 Hz, a sampling time interval of 1/120 sec may be selected for a case where signal is overlapped with hum caused by an AC electric power source of 60 Hz.

Generally speaking, AC hum at a period of T can be eliminated by selecting time interval $t_0$ between measuring times $t_1$ and time $t_2$ at $(2n+1)(T/2)$ ($n = 0, 1, 2 \ldots$) and averaging values obtained at $t_1$ and $t_2$ respectively.

Described above is a method to eliminate noise by averaging measured values obtained at two predetermined measuring points. However, it is possible to select measuring points in an even number larger than two, for example, at times of $t_1$, $t_1 + (T/2)$, $t_1 + T$, $t_1 + (3T/2)$, ... and average measured values obtained at these points. That is to say, correct DC signal level can be determined by selecting any one of time intervals $t_0$ which can be expressed as $t_0 = (2n+1)(T/2)$ (for example, $t_0 = T/2, 3T/2, 5T/2, \ldots$) and averaging an even number of values measured at this time interval. However, it is not preferable to run measurements for too long a time since DC signal level may change during this while.

Figure 3:
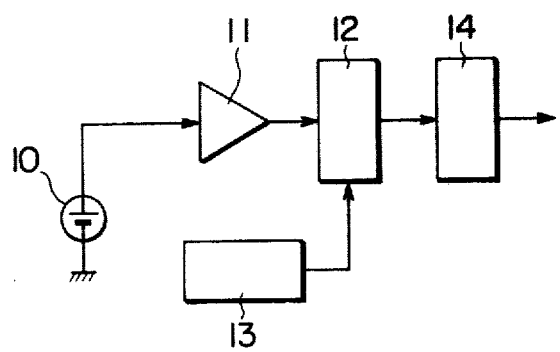
FIG. 3 shows a block diagram illustrating an example of the circuit designed on the basis of the method according to the present invention.

FIG. 3 shows a block diagram of a circuit for carrying out noise elimination based on the method according to the present invention. In this diagram, the reference numeral 11 represents an amplifier which provides an amplified measuring signal 10 consisting of a DC signal overlapped with AC hum. This signal is fed into an A/D converter 12 and transformed into a digital signal. Further, sampling time interval $t_0$ is determined by a pulse generator 13 and is signal level measured at $t_0$ supplied to an operation circuit 14. The operation circuit calculates an average value of digital signal levels measured at two points (or an even number of points) and provides it as output. This output corresponds to a DC signal level from which AC hum has been eliminated as already described above.

As is understood from the foregoing descriptions, the method according to the present invention makes it possible to eliminate noise through very simple procedures of setting a sampling time interval in accordance with frequency of noise to be eliminated, measuring signals levels at the present sampling time interval and calculating an average values of the measured signal level.

We claim:

1. In measurement of signals containing noise at a known frequency, a method for eliminating the noise comprising the steps of measuring the signals an even number of times at time intervals equal to odd multiples of half the period of the noise, and automatically calculating an average of the measured values obtained by said measurements.

2. In measurement of signals containing noise at a known frequency, a method for eliminating the noise comprising the steps of measuring the signals an even number of times at time intervals equal to half the period of the noise, and automatically calculating an average of the measured values obtained by said measurements.

3. In measurement of signals containing noise at a known frequency, a method for eliminating the noise comprising the steps of measuring the signals twice at a time interval equal to odd multiples of half the noise period, and automatically calculating the measured values obtained by said measurements.

4. In measurement of signals containing noise at a known frequency, a method for eliminating the noise comprising the steps of measuring the signals twice at a time interval equal to half the noise period, and automatically calculating an average of the measured values obtained by said measurements.

5. In combination, apparatus for eliminating noise having a known frequency from signals, comprising an amplifier for amplifying measured output signals, an A/D converter for converting the signals provided from said amplifier into digital signals, a pulse generator for generating pulses at time intervals equal to half the noise period and a circuit for calculating an average.

* * * * *